(12) United States Patent
Bolotov et al.

(10) Patent No.: US 11,329,005 B2
(45) Date of Patent: May 10, 2022

(54) SEMICONDUCTOR DEVICE AND METHOD OF PRODUCING THE SAME

(71) Applicant: Dexerials Corporation, Tokyo (JP)

(72) Inventors: Sergey Bolotov, Tokyo (JP); Yusuke Kubo, Tokyo (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 16/973,765

(22) PCT Filed: Jun. 19, 2019

(86) PCT No.: PCT/JP2019/024363
§ 371 (c)(1),
(2) Date: Dec. 10, 2020

(87) PCT Pub. No.: WO2019/244950
PCT Pub. Date: Dec. 26, 2019

(65) Prior Publication Data
US 2021/0225777 A1 Jul. 22, 2021

(30) Foreign Application Priority Data

Jun. 21, 2018 (JP) .............................. JP2018-118080

(51) Int. Cl.
*H01L 23/552* (2006.01)
*H01L 23/367* (2006.01)
(Continued)

(52) U.S. Cl.
CPC ........ *H01L 23/552* (2013.01); *H01L 21/4871* (2013.01); *H01L 23/367* (2013.01); *H01L 23/3737* (2013.01)

(58) Field of Classification Search
CPC . H01L 23/552; H01L 23/367; H01L 23/3737; H01L 21/4871
See application file for complete search history.

(56) References Cited

U.S. PATENT DOCUMENTS

| 6,111,313 | A | * | 8/2000 | Kutlu | ...................... H01L 23/36 257/697 |
| 6,488,806 | B2 | * | 12/2002 | Carden | ................... H01L 24/31 156/311 |

(Continued)

FOREIGN PATENT DOCUMENTS

| JP | H06169188 A | 6/1994 |
| JP | 2001148586 A | 5/2001 |

(Continued)

OTHER PUBLICATIONS

Dec. 24, 2020, International Preliminary Report on Patentability issued in the International Patent Application No. PCT/JP2019/024363.

(Continued)

*Primary Examiner* — Peniel M Gumedzoe
(74) *Attorney, Agent, or Firm* — Kenja IP Law PC

(57) ABSTRACT

Provided is a semiconductor device having excellent heat dissipation capacity and electromagnetic wave suppression effect. A semiconductor device 1 includes a semiconductor device 30; a tubular conductive shield can 20 provided to surround a side surface 30a of the semiconductor device 30; a conductive cooling member 40; and a conductive thermally conductive sheet 10 formed between the semiconductor device 30 and the cooling member 40. The conductive shield can 20 and the cooling member 40 are electrically connected through the conductive thermally conductive sheet 10 therebetween.

11 Claims, 6 Drawing Sheets

(51) Int. Cl.
*H01L 23/373* (2006.01)
*H01L 21/48* (2006.01)

(56) References Cited

U.S. PATENT DOCUMENTS

| | | | | |
|---|---|---|---|---|
| 2006/0084254 A1* | 4/2006 | Attarwala | ............... | H01L 24/75 |
| | | | | 438/584 |
| 2013/0256894 A1* | 10/2013 | Adema | ................... | H01L 24/29 |
| | | | | 257/762 |
| 2019/0181113 A1* | 6/2019 | Morita | ................. | H01L 23/367 |

FOREIGN PATENT DOCUMENTS

| | | | |
|---|---|---|---|
| JP | 2008166641 | A | 7/2008 |
| JP | 2012164852 | A | 8/2012 |
| JP | 2016096249 | A | 5/2016 |
| JP | 2017038086 | A | 2/2017 |
| JP | 2017057246 | A | 3/2017 |
| JP | 2018073897 | A | 5/2018 |
| JP | 2018107272 | A | 7/2018 |

OTHER PUBLICATIONS

Sep. 10, 2019, International Search Report issued in the International Patent Application No. PCT/JP2019/024363.
Jan. 25, 2022, Office Action issued by the Korean Intellectual Property Office in the corresponding Korean Patent Application No. 10-2020-7036260.

* cited by examiner

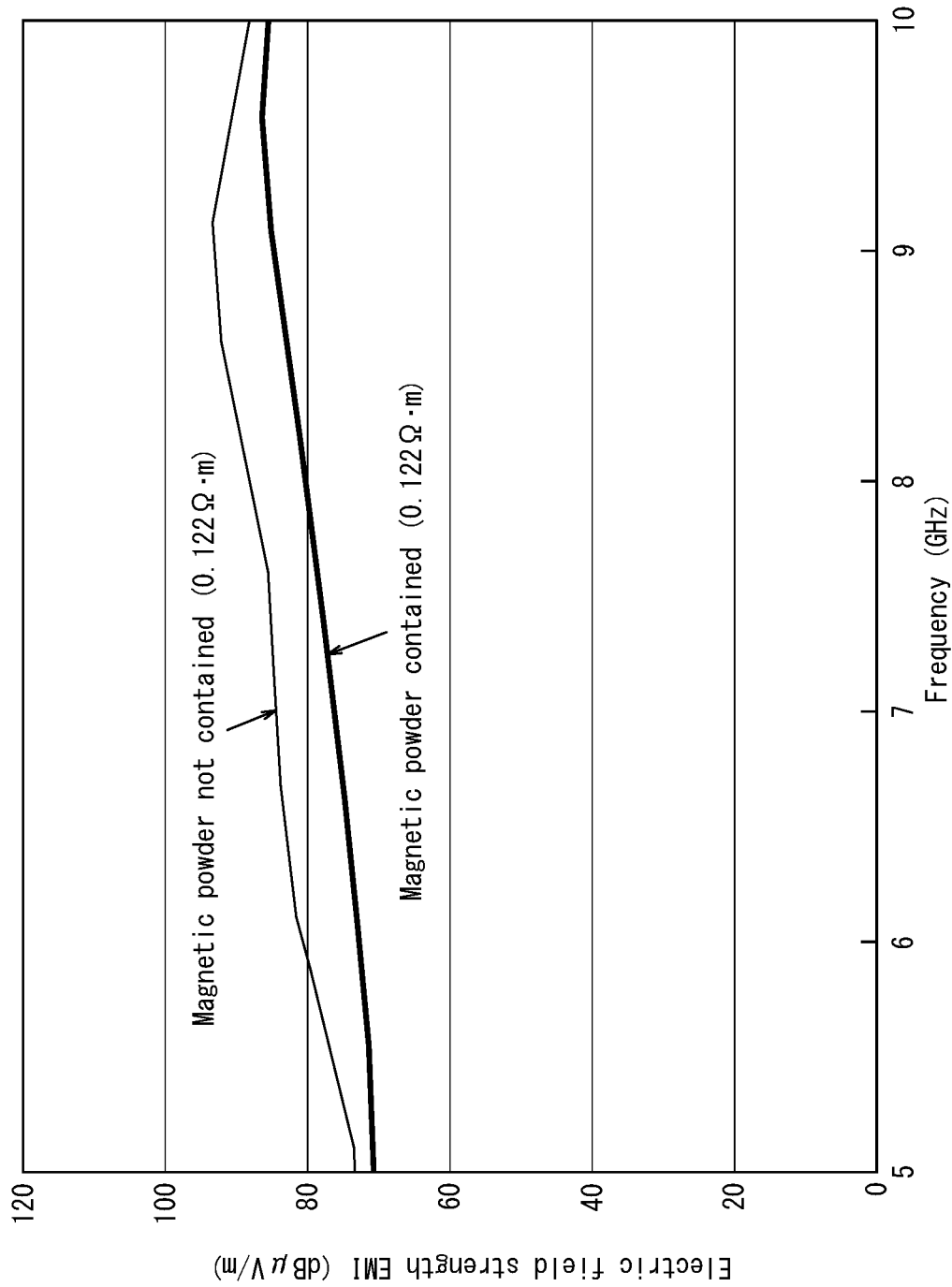

SEMICONDUCTOR DEVICE AND METHOD OF PRODUCING THE SAME

TECHNICAL FIELD

The present disclosure relates to a semiconductor device having excellent heat dissipation capacity and electromagnetic wave suppression effect, and a method of producing the semiconductor device.

BACKGROUND

Recent years have seen size reductions of electronic devices. Meanwhile, because power consumption cannot be significantly changed in order to cover a variety of applications, heat dissipation measures for the devices have become more important.

As heat dissipation measures for electronic devices, for example, radiator plates, heat pipes, and heatsinks made of a metallic material having high thermal conductivity such as copper or aluminum are widely used. Such a heat dissipating component with excellent thermal conductivity is located near an electronic component, such as a semiconductor package, which is a heat generating portion in an electronic device in order to dissipate heat or to reduce temperature variations in the device. The heat dissipating component with excellent thermal conductivity is also placed to extend from the electronic component which is a heat generating portions to a low-temperature area.

Note that the heat generating portion in the electronic device is an electronic component such as a semiconductor element with high current density, and high current density is considered to indicate that the strength of an electric field or a magnetic field which can cause an unwanted radiation component is likely to be high. Accordingly, if the heat dissipating component made of metal is placed near in the proximity of an electronic component, the heat dissipating component would not only absorb heat, but also would pick up harmonic components of an electric signal passing through the electronic component. Specifically, since the heat dissipating component is made of a metallic material, the above problem is found when the heat dissipating component acts as an antenna for the harmonic components or acts as a transmission path for the harmonic noise components.

The development of techniques to achieve both heat dissipation capacity and electromagnetic wave suppression effect is therefore desirable.

For example, JP 2012-164852 A (PTL 1) discloses a technique of providing, in a shield member having a large opening, a semiconductor package with a lid attached thereto and an annular lid contact portion in electrical contact with the upper peripheral edge of the lid, and electrically connecting the lid contact portion and the shield member.

The technique described in PTL 1 produces certain levels of heat dissipation capacity and electromagnetic wave suppression effect. However, it is considered in the case where a substrate or a cooling member is large, electromagnetic resonance occurs, and sufficient electromagnetic wave suppression effect cannot be achieved. Moreover, further improvement in heat dissipation capacity has been desired.

CITATION LIST

Patent Literature

PTL 1: JP 2012-164852 A

SUMMARY

Technical Problem

It could therefore be helpful to provide a semiconductor device having excellent heat dissipation capacity and electromagnetic wave suppression effect.

Solution to Problem

Through extensive studies, we recognized that high electromagnetic wave suppression effect can be achieved by covering a semiconductor element with a conductive shield can connected to a ground. Since sufficient heat dissipation capacity cannot be obtained by only providing a conductive shield can, further extensive studies demonstrated that heat dissipation capacity can be improved by forming a conductive thermally conductive sheet between a semiconductor element and a conductive cooling member thereby connecting the semiconductor element and the cooling member. Further, when the conductive shield can covering the semiconductor element has a structure obtained by removing the top face is removed, in other words, the conductive shield can has a tubular shape, and at the same time the conductive shield can and the cooling member are electrically connected through the conductive thermally conductive sheet therebetween; an electrically closed space can be formed in the semiconductor device. Thus, we thus found that the electromagnetic wave suppression effect can also be significantly improved.

Hence, a semiconductor device according to the present disclosure can provide both heat dissipation capacity and electromagnetic wave suppression effect at higher levels than conventional techniques. In addition, since the top face of the conductive shield can is not formed in the semiconductor device according to the present disclosure, the semiconductor device can be made thinner and produced more easily.

The present disclosure is based on the above findings. We herein propose the following features.

(1) A semiconductor device comprising:
a semiconductor element provided on a substrate;
a tubular conductive shield can provided to surround a side surface of the semiconductor element, the conductive shield can being connected to a ground;
a conductive cooling member provided over the semiconductor element and the conductive shield can; and
a conductive thermally conductive sheet formed between the semiconductor element and the cooling member,
wherein the conductive shield can and the cooling member are electrically connected through the conductive thermally conductive sheet therebetween.

(2) The semiconductor device according to (1) above, wherein a spacing between parts of the conductive shield can facing each other with the semiconductor element therebetween is less than or equal to $1/10$ of a wavelength at a maximum frequency of the semiconductor element.

(3) The semiconductor device according to (1) or (2) above, wherein an upper end of the conductive shield can bites into the conductive thermally conductive sheet.

(4) The semiconductor device according to any one of (1) to (3) above, wherein a resistivity of the conductive thermally conductive sheet is $0.15$ $\Omega \cdot m$ or less.

(5) The semiconductor device according to any one of (1) to (4) above, wherein a resistivity of the conductive thermally conductive sheet is $1.5 \times 10^{-7}$ $\Omega \cdot m$ or more.

(6) The semiconductor device according to any one of (1) to (5) above, wherein the conductive thermally conductive sheet has magnetic properties.

(7) The semiconductor device according to any one of (1) to (6) above, wherein the conductive thermally conductive sheet has tackiness or adhesiveness at a surface thereof.

(8) The semiconductor device according to any one of (1) to (7) above, wherein the conductive thermally conductive sheet has flexibility.

(9) The semiconductor device according to any one of (1) to (8) above, wherein the conductive thermally conductive sheet contains a cured resin.

(10) The semiconductor device according to any one of (1) to (9) above, wherein the conductive thermally conductive sheet contains a conductive filler.

(11) The semiconductor device according to (10) above, wherein the conductive filler is carbon fiber.

(12) A method of producing the semiconductor device according to any one of (1) to (11) above, the method comprising: a step of fixing by pressure a conductive thermally conductive sheet to an upper end of a tubular conductive shield can provided to surround a side surface of a semiconductor element, thereby joining the conductive shield can and the conductive thermally conductive sheet.

With the above features, a semiconductor device having excellent heat dissipation capacity and electromagnetic wave suppression effect can be produced.

Advantageous Effect

It is thus possible to provide a semiconductor device having excellent heat dissipation capacity and electromagnetic wave suppression effect.

BRIEF DESCRIPTION OF THE DRAWINGS

In the accompanying drawings:

FIG. 5A illustrates a top view of the model of a semiconductor device, and FIG. 5B is a bottom view of the model of the model of a semiconductor device;

FIG. 7 is a graph of the electric field strength in accordance with the frequency in the case where the magnetic properties of a conductive thermally conductive sheet of a semiconductor device are changed in Example 2.

DETAILED DESCRIPTION

Embodiments of the present disclosure will now be described in detail with reference to the drawings.

Figure 1:
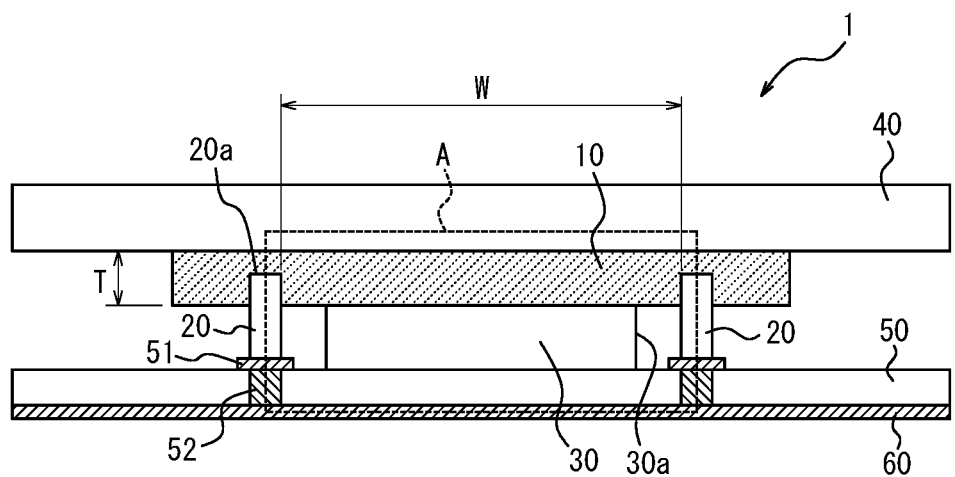
FIG. 1 is a diagram schematically illustrating a cross section of a semiconductor device according to one embodiment of the present disclosure.
Figure 2:
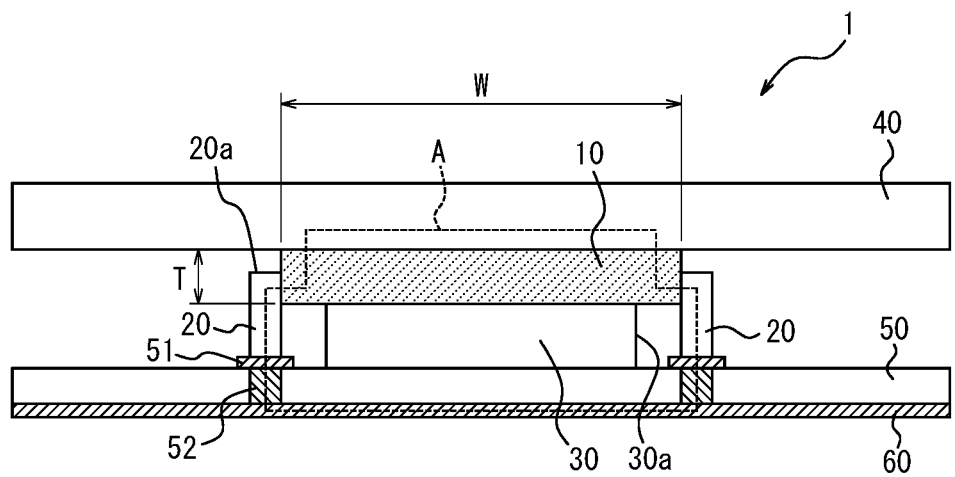
FIG. 2 is a diagram schematically illustrating a cross section of a semiconductor device according to another embodiment of the present disclosure.
Figure 4:
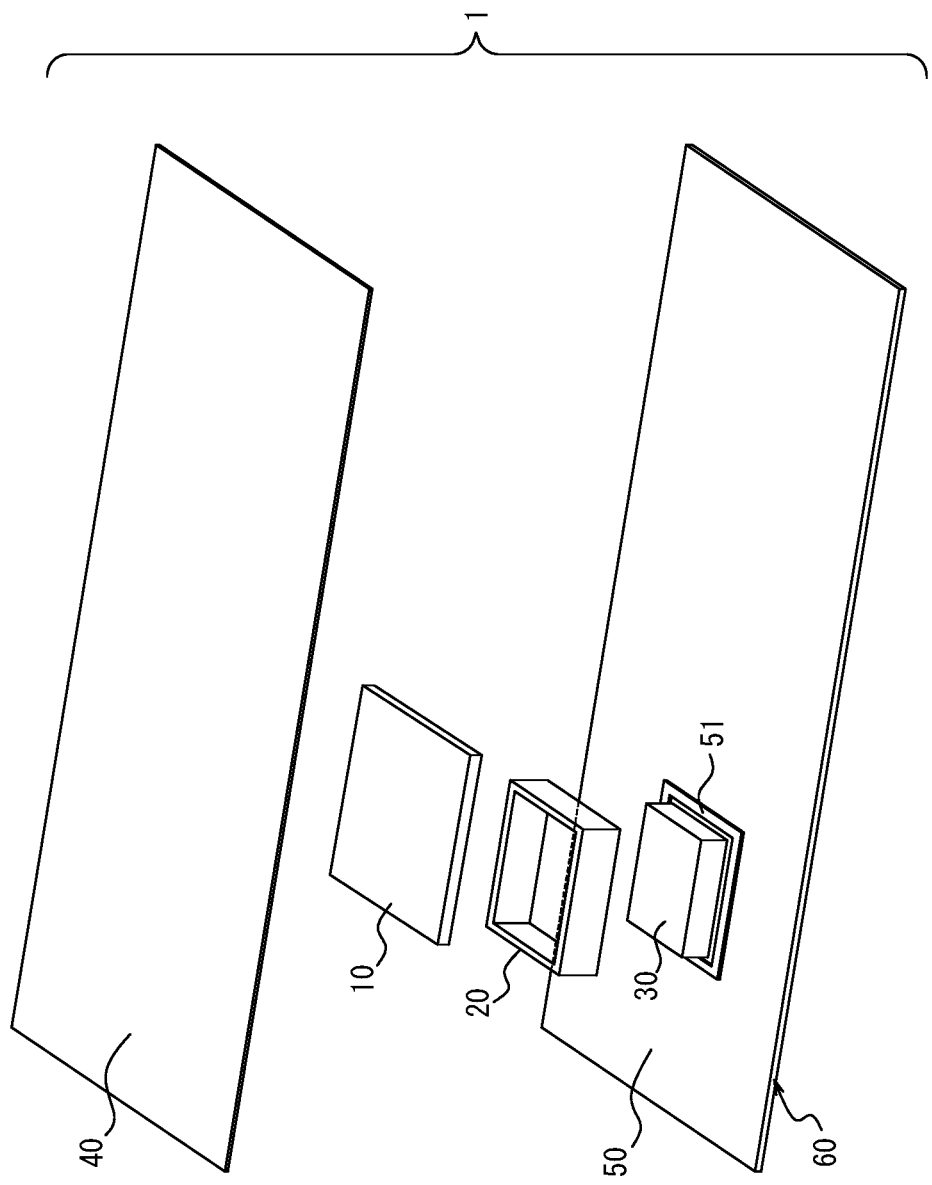
FIG. 4 is a perspective view schematically illustrating the assembly of a semiconductor device according to one embodiment of the present disclosure.

Here, FIGS. 1 and 2 are diagrams each schematically illustrating a cross section of a semiconductor device according to one embodiment of the present disclosure. FIG. 4 is a perspective view illustrating the assembly of a semiconductor device according to one embodiment of the present disclosure. In each drawing, the shape and scale of each member are different from the actual shape and scale, for convenience of description. The shape and scale of each member may be changed as appropriate for each semiconductor device, unless otherwise specified herein.

<Semiconductor Device>

A semiconductor device 1 according to the present disclosure includes a semiconductor element 30, a conductive shield can 20, a conductive cooling member 40, and a conductive thermally conductive sheet 10 as illustrated in FIGS. 1 and 2.

As illustrated in FIGS. 1 and 2, in the semiconductor device 1 according to the present disclosure, the conductive shield can 20 has a tubular shape and is provided to surround the side surface 30a of the semiconductor element 30, the conductive thermally conductive sheet 10 is formed between the semiconductor element 30 and the cooling member 40, and the conductive shield can 20 and the cooling member 40 are electrically connected through the conductive thermally conductive sheet 10 therebetween.

The semiconductor element 30 is a source of heat and electromagnetic waves. Covering the semiconductor element 30 with the conductive shield can 20 allows for electromagnetic shielding, thereby achieving excellent electromagnetic wave suppression effect. Moreover, when the conductive shield can 20 has a tubular shape obtained by removing an upper face (the top layer in the stack structure), and a conductive sheet member having high thermal conductivity (conductive thermally conductive sheet 10) is provided between the semiconductor element 30 and the cooling member 40 in the conductive shield can 20, thermal conduction to the cooling member 40 is significantly improved. Hence, electromagnetic wave suppression effect can be achieved, and excellent heat dissipation capacity can be obtained.

Further, in the semiconductor device 1 of the present disclosure, electrical connection between the conductive shield can 20 and the cooling member 40 with the conductive thermally conductive sheet 10 therebetween forms an electrically closed space (a space enclosed by broken lines in FIGS. 1 and 2) in the semiconductor device 1 according to the present disclosure. This results in increased electromagnetic shielding effect of the conductive shield can 20 and excellent electromagnetic wave suppression effect.

Moreover, in the semiconductor device 1 of the present disclosure, since the upper face of the conductive shield can 20 is not provided, the semiconductor device 1 can be made thinner, and the conductive thermally conductive sheet 10 can be more easily provided between the semiconductor element 30 and the cooling member 40 as compared with a technique using a conventional conductive shield can. This also makes the production easier.

Figure 3:
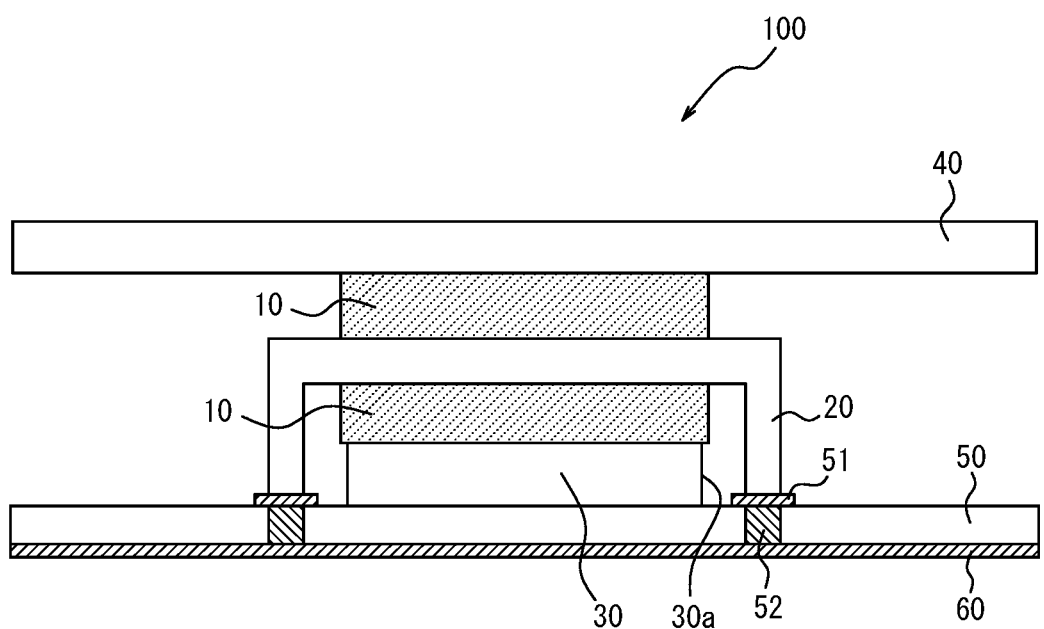
FIG. 3 is a diagram schematically illustrating a cross section of a conventional semiconductor device according to one embodiment.

FIG. 3 illustrates an example of a semiconductor device according to conventional techniques. Since the conductive shield can 20 is provided to cover the semiconductor element 30 in a conventional semiconductor device 100, high electromagnetic wave suppression effect can be obtained. However, as compared with the semiconductor device 1 of the present disclosure, sufficient heat dissipation capacity cannot be obtained due to high thermal resistance between the semiconductor element 30 and the cooling member 40, since the semiconductor device 1 of the present disclosure has a structure in which the conductive thermally conductive sheet 10 is stacked with the conductive shield can 20 thereunder.

Each member included in the semiconductor device according to the present disclosure will be described below.

(Semiconductor Element)

The semiconductor device 1 according to the present disclosure includes the semiconductor element 30 provided on a substrate 50, as illustrated in FIGS. 1 and 2.

The semiconductor element is not limited, as long as it is an electronic component using a semiconductor. Examples include integrated circuits such as ICs and LSIs, CPUs, MPUs, graphic processing units, and image sensors.

The substrate 50 on which the semiconductor element 30 is formed is not limited, and a suitable substrate may be used depending on the type of the semiconductor device. The substrate 50 is provided with a ground (GND) 60. The ground 60 is formed inside or on the back of the substrate 50 (the back of the substrate in FIGS. 1 and 2).

Further, in the semiconductor device 1 according to the present disclosure, for example, a land 51 can be provided on the surface of the substrate 50 so as to wholly or partially surround the semiconductor element 30, and the conductive shield can 20 may be connected to this part using solder or the like, as illustrated in FIGS. 1 and 2. The land 51 is electrically connected to the ground 60 via a conductively-treated through hole 52 formed in the substrate 50. Thus, the conductive shield can 20 can be electrically joined to the ground 60. The conductive shield can 20 is provided on the land 51 to be electrically connected to the ground 60 in FIGS. 1 and 2; alternatively, the conductive shield can 20 may penetrate the substrate 50 so as to be directly connected to the ground 60.

(Conductive Shield can)

The semiconductor device 1 according to the present disclosure is connected to the ground 60 as illustrated in FIGS. 1 and 2, and includes the conductive shield can 20 that is tubular and is provided to surround the side surface 30a of the semiconductor element 30.

The conductive shield can 20 connected to the ground 60 can serve as a shield against electromagnetic waves. This improves the electromagnetic wave suppression effect of the semiconductor device 1 according to the present disclosure.

Here, the material forming the conductive shield can 20 is not limited, and a material having high electromagnetic shielding effect is used. Examples include highly conductive metals such as aluminum, copper, and stainless steel, and highly conductive magnetic materials. Examples of the highly conductive magnetic materials include permalloy, Sendust, Fe-based or Co-based amorphous materials, and microcrystalline materials. In the case where such a magnetic material is used as the material forming the conductive shield can 20, not only electric shielding effect but also magnetic shielding effect and magnetic absorption effect can be expected to be obtained.

The conductive shield can 20 is tubular, and has a shape obtained by removing an upper face (the top layer in the stack structure) portion of the conventional structure as depicted in FIG. 3. Since the conductive shield can 20 is shaped like a tube, the conductive thermally conductive sheet 10 to be described is formed inside the tube. Thus, the semiconductor element 30 and the cooling member 40 can be connected, resulting in excellent heat dissipation.

Here, the shape of the tube is not limited, and may be changed as appropriate depending on the size and the shape of the semiconductor element 30, and the like. For example, as illustrated in FIGS. 1 and 2, the tube may be a rectangular tube; alternatively, the tube may have a cylindrical shape or may be a tube having another irregular shape. In terms of dissipating heat from the semiconductor element 30, a spacing W between parts of the conductive shield can 20 facing each other with the semiconductor element 30 therebetween is preferably made large, and thus a large conductive thermally conductive sheet 10 is preferably used.

Further, in terms of further improving the electromagnetic wave suppression effect, the spacing W between parts of the conductive shield can 20 facing each other with the semiconductor element therebetween is preferably equal to or less than 1/10 of the wavelength at the maximum frequency of the semiconductor element 30 when a cross section taken along the stacking direction is viewed. For example, when the frequency of the semiconductor element 30 is 1 GHz, the wavelength is 300 mm (speed of light/frequency); accordingly, the spacing W is preferably 30 mm or less.

(Cooling Member)

The semiconductor device 1 according to the present disclosure includes the conductive cooling member 40 provided over the semiconductor element 30 and the conductive shield can 20 as illustrated in FIGS. 1 and 2.

The cooling member 40 is a member that absorbs heat generated from the heat source (semiconductor element 30) and dissipates it to the outside. When connected to the semiconductor element 30 via the conductive thermally conductive sheet 10 to be described, the cooling member 40 can diffuse heat generated by the semiconductor element 30 to the outside, thus ensuring high heat dissipation capacity of the semiconductor device.

Since the cooling member 40 has electrical conductivity, when the cooling member 40 is electrically connected to the conductive shield can 20 via the conductive thermally conductive sheet 10 to be described, an electrically closed space (region A enclosed by the dashed lines in FIGS. 1 and 2) is formed, thus enhancing the electromagnetic wave suppression effect of the semiconductor device 1.

The type of the conductive cooling member 40 is not limited, and may be determined as appropriate depending on the type of the semiconductor device 1 according to the present disclosure. Examples include a radiator, a cooler, a heatsink, a heat spreader, a die pad, a cooling fan, a heat pipe, a metallic cover, and a cabinet. Of these conductive cooling members, a conductive radiator, cooler, or heatsink is preferred because higher heat dissipation capacity can be achieved. Further, the material forming the conductive cooling member 40 preferably includes a metal such as aluminum, copper, and stainless steel and graphite, in terms of enhancing thermal conductivity.

While the conductive cooling member 40 is provided above the conductive shield can 20, preferably the conductive cooling member 40 is not in contact with the conductive shield can 20 and is at a predetermined distance from the conductive shield can 20, as illustrated in FIGS. 1 and 2. This is because the conductive thermally conductive sheet 10 to be described is made to fill a space between the upper face 20a of the conductive shield can 20 and the conductive cooling member 40.

The conductive cooling member 40 may have a projection (not shown) in the part of its back surface in contact with the conductive thermally conductive sheet 10 described below. Providing such a projection provides a smaller spacing between the conductive cooling member 40 and each of the conductive thermally conductive sheet 10 and the conductive shield can 20 provided with the conductive thermally conductive sheet 10 therebetween, and firm connection can be achieved even in the case where the conductive thermally conductive sheet 10 is a film or the like.

(Conductive Thermally Conductive Sheet)

As illustrated in FIGS. 1 and 2, the semiconductor device 1 according to the present disclosure includes the conductive thermally conductive sheet 10 formed between the semiconductor element 30 and the conductive cooling member 40, and in the semiconductor device, the conductive shield can 20 and the cooling member 40 are electrically connected through the conductive thermally conductive sheet 10 therebetween.

When the conductive thermally conductive sheet 10 having high thermal conductivity is provided between the semiconductor element 30 and the cooling member 40, heat dissipation capacity can be improved without reducing the electromagnetic wave suppression effect. In addition, when the conductive shield can 20 and the cooling member 40 are electrically connected via the conductive thermally conductive sheet 10, an electrically closed space A is formed in the semiconductor device 1 according to the present disclosure as illustrated in FIGS. 1 and 2, resulting in enhanced electromagnetic shielding effect of the conductive shield can 20. Thus, excellent electromagnetic wave suppression effect can be achieved.

The shape of the conductive thermally conductive sheet 10 is not limited, and may be changed as appropriate depending on, for example, the shape of the conductive shield can 20 or the semiconductor element 30.

Although the size of the conductive thermally conductive sheet 10 is not limited, the conductive thermally conductive sheet 10 is required to fill in the opening of the conductive shield can 20 without gaps as illustrated in FIGS. 1 and 2. This ensures the electrical connection between the conductive shield can 20 and the cooling member 40.

Further, the upper end 20a of the conductive shield can 20 preferably bites into the conductive thermally conductive sheet 10 as illustrated in FIG. 1 (in other words, the area of the bottom surface of the conductive thermally conductive sheet 10 is preferably larger than the opening area of the tubular conductive shield can 20). As compared with the aspect in which the conductive thermally conductive sheet 10 is filled inside the conductive shield can 20 as illustrated in FIG. 2, the electrical connection between the conductive shield can 20 and the cooling member 40 is made more efficiently, resulting in further enhanced electromagnetic wave suppression effect. Further, this can increase the joint force between the conductive thermally conductive sheet 10 and the conductive shield can 20.

The conductive thermally conductive sheet 10 may be a single layer sheet, or may be made up of a plurality of sheets.

For example, in the case where the conductive thermally conductive sheet 10 does not cover the upper end 20a of the shield can 20 as illustrated in FIG. 2, the conductive thermally conductive sheet 10 may be a single layer sheet. Alternatively, the conductive thermally conductive sheet 10 may be made up of a plurality of sheets, for example to ease the adjustment of the sheet thickness.

Further, as illustrated in FIG. 1, when the conductive thermally conductive sheet 10 covers the upper end 20a of the conductive shield can 20, the conductive shield can 20 may be fixed by pressure using a single sheet of the conductive thermally conductive sheet 10. Alternatively, the conductive thermally conductive sheet 10 may be formed by combining a plurality of sheets.

The thickness T of the conductive thermally conductive sheet 10 is not limited, and may be changed as appropriate depending on the distance between the semiconductor element 30 and the cooling member 40, the size of the conductive shield can 20, and the like. In terms of achieving higher heat dissipation capacity and electromagnetic wave suppression effect, the thickness T of the conductive thermally conductive sheet 10 is preferably 50 μm to 4 mm, more preferably 100 μm to 4 mm, and particularly preferably 200 μm to 3 mm. If the thickness T of the conductive thermally conductive sheet 10 is more than 4 mm, the distance between the semiconductor element 30 and the cooling member 40 is longer, which is likely to cause a decrease in thermal conduction. If the thickness T of the conductive thermally conductive sheet 10 is less than 50 μm, the electromagnetic wave suppression effect is likely to decrease.

Here, the thickness T of the conductive thermally conductive sheet 10 refers to the thickness T of the thickest part of the conductive thermally conductive sheet 10 as illustrated in FIGS. 1 and 2, regardless of whether the conductive thermally conductive sheet 10 is formed from a single sheet or a plurality of sheets.

The conductive thermally conductive sheet 10 preferably has high conductivity in terms of achieving excellent electromagnetic wave suppression effect.

Specifically, the resistivity of the conductive thermally conductive sheet 10 is preferably 0.15 Ω·m or less, more preferably 1.5×10-2 Ω·m or less, still more preferably 1.5×10-3 Ω·m or less, and particularly preferably 1.5×10-4 Ω·m or less. When the resistivity of the conductive thermally conductive sheet 10 is 0.15 Ω·m or less, more excellent electromagnetic wave suppression effect can be obtained.

Further, the resistivity of the conductive thermally conductive sheet 10 is preferably 1.5×10-7 Ω·m or more. This increases the electromagnetic wave suppression effect due to the conduction loss caused by induced currents generated when electromagnetic waves pass through the material.

The method of adjusting the conductivity (resistivity) of the conductive thermally conductive sheet 10 is not limited; for example, the adjustment may be performed by changing the type of a binder resin; the material, the amount added, and the orientation of a filler; etc.

Further, the thermal conductivity of the conductive thermally conductive sheet 10 is preferably 5 W/mK or more, more preferably 10 W/mK or more, and particularly preferably 20 W/mK or more. This can further increase the efficiency of the heat exchange between the semiconductor element 30 and the cooling member 40, which further improves the heat dissipation capacity.

In addition, the conductive thermally conductive sheet 10 preferably has magnetic properties. This can impart electromagnetic wave absorption properties to the conductive thermally conductive sheet 10, thus more excellent electromagnetic wave suppression effect can be obtained.

Here, the method of adjusting the magnetic properties of the conductive thermally conductive sheet 10 is not limited; the adjustment can be performed for example by changing the amount of magnetic powder or the like contained in the conductive thermally conductive sheet 10.

In addition, the conductive thermally conductive sheet 10 preferably has tackiness or adhesiveness at its surface. This improves the adhesion between the conductive thermally conductive sheet 10 and other components. In the case where the conductive thermally conductive sheet 10 is made up of a plurality of sheets, the adhesion between the sheets can also be improved.

The method of imparting tackiness to the surface of the conductive thermally conductive sheet 10 is not limited. For example, tackiness may be imparted by optimizing the binder resin described below forming the conductive thermally conductive sheet 10. Alternatively, an adhesion layer having tackiness may be provided on the surface of the conductive thermally conductive sheet 10.

In addition, the conductive thermally conductive sheet 10 preferably has flexibility. This makes it easy to change the shape of the conductive thermally conductive sheet 10, which facilitates the assembly of the semiconductor device 1, and also increases the joint force between the conductive thermally conductive sheet 10 and the conductive shield can 20. For the flexibility of the conductive thermally conductive sheet 10, for example, the storage modulus at 25° C. measured by a dynamic modulus measurement is preferably in a range of 50 kPa to 50 MPa.

In addition, the conductive thermally conductive sheet 10 preferably contains a cured resin. This allows the conductive thermally conductive sheet 10 to have high flexibility, tackiness of the surface, and the like.

The material forming the conductive thermally conductive sheet 10 is not limited, as long as it provides excellent electromagnetic wave absorption performance and thermal conductivity.

For example, in terms of achieving high electromagnetic wave absorption properties and thermal conductivity, the conductive thermally conductive sheet may contain a binder resin, a thermally conductive filler, and other components.

Materials forming the conductive thermally conductive sheet 10 will be described below.

Binder Resin

A binder resin forming the conductive thermally conductive sheet refers to a resin component that is a base material of the conductive thermally conductive sheet. The type of the binder resin is not limited, and a known binder resin may be selected as appropriate. An example of the binder resin is thermosetting resin.

Examples of the thermosetting resin include cross-linkable rubber, epoxy resin, polyimide resin, bismaleimide resin, benzocyclobutene resin, phenol resin, unsaturated polyester, diallyl phthalate resin, silicone, polyurethane, polyimide silicone, thermosetting polyphenylene ether, and thermosetting modified polyphenylene ether. These may be used alone or in combination of two or more.

Examples of the cross-linkable rubber include natural rubber, butadiene rubber, isoprene rubber, nitrile rubber, hydrogenated nitrile rubber, chloroprene rubber, ethylene propylene rubber, chlorinated polyethylene, chlorosulfonated polyethylene, butyl rubber, halogenated butyl rubber, fluororubber, urethane rubber, acrylic rubber, polyisobutylene rubber, and silicone rubber. These may be used alone or in combination of two or more.

Of the above thermosetting resins, silicone is preferably used in terms of excellent formability and weather resistance and also in terms of adhesion and followability to the electronic component. The silicone is not limited, and the type of the silicone may be selected as appropriate depending on the purpose.

In terms of formability, weather resistance, adhesion, etc., silicone containing a liquid silicone gel as a base compound and a hardener is preferred. Examples of such a silicone include addition-reaction liquid silicone, high-temperature vulcanization millable type silicone using a peroxide for vulcanization, etc.

As the addition-reaction liquid silicone, for example, two-part addition-reaction type silicone containing, as the base compound, polyorganosiloxane having a vinyl group and, as the hardener, polyorganosiloxane having a Si—H group is preferred.

In the combination of the base compound of the liquid silicone gel and the hardener, the compounding ratio of the base compound and the hardener (base compound:hardener) is preferably 35:65 to 65:35 in mass ratio.

The content of the binder resin in the conductive thermally conductive sheet is not limited, and may be selected as appropriate depending on the purpose. For example, in terms of ensuring the formability of the sheet and the adhesion of the sheet, the content of the binder resin is preferably approximately 20 vol % to 50 vol % and more preferably 30 vol % to 40 vol % of the conductive thermally conductive sheet.

Conductive Thermally Conductive Filler

In the conductive thermally conductive sheet, the binder resin contains a thermally conductive filler having conductivity (hereinafter also simply referred to as "thermally conductive filler"). The conductive thermally conductive filler is a component for improving the thermal conductivity and the electrical conductivity of the sheet.

Here, although the type of the thermally conductive filler is not limited, in terms of achieving higher thermal conductivity, fibrous thermally conductive filler is preferably used.

The term "fibrous" of the fibrous thermal conductive filler refers to a shape with a high aspect ratio (approximately 6 or more). Accordingly, in the present disclosure, the "fibrous thermal conductive filler" encompasses, for example, not only fibrous and bar-shaped thermal conductive fillers but also particulate fillers and flaky thermal conductive fillers that are high in aspect ratio.

Here, the kind of the fibrous thermally conductive filler is not limited as long as a fibrous, highly thermally conductive, and highly electrically conductive material is used; for example, a metal such as silver, copper, or aluminum, a ceramic such as alumina, aluminum nitride, silicon carbide, or graphite, or carbon fibers can be used.

Of such fibrous thermally conductive fillers, carbon fibers are more preferably used in terms of achieving higher thermal conductivity and electrical conductivity.

Note that one kind of the conductive thermally conductive filler may be used alone, or two or more kinds may be used as a mixture. Further, when two or more thermally conductive fillers are used, all of them may be fibrous thermally conductive fillers, or at least one fibrous thermally conductive filler may be used in combination with one or more thermally conductive fillers containing particles with a shape other than a fibrous shape.

The type of the carbon fibers is not limited, and may be selected as appropriate depending on the purpose. Examples include pitch-based carbon fibers, PAN-based carbon fibers, carbon fibers obtained by graphitizing PBO fibers, and carbon fibers synthesized by methods such as arc discharge, laser evaporation, chemical vapor deposition (CVD), or catalytic chemical vapor deposition (CCVD). Of these, carbon fibers obtained by graphitizing PBO fibers and pitch-based carbon fibers are more preferable, in terms of achieving high thermal conductivity and electrical conductivity.

Further, the carbon fibers may be partly or wholly subjected to surface treatment as necessary before use. Examples of the surface treatment include oxidation treatment, nitriding treatment, nitration, sulfonation, or treatments in which a metal, a metal compound, an organic compound, or the like is attached or coupled to a functional group introduced into the surfaces of the carbon fibers by any of these treatments or to the surfaces of the carbon fibers. Examples of the functional group include a hydroxyl group, a carboxyl group, a carbonyl group, a nitro group, and an amino group.

The average fiber length (average major axis length) of the fibrous thermally conductive filler is not limited, and may be selected as appropriate. In terms of ensuring high thermal conductivity, the average fiber length is preferably in a range of 50 μm to 300 μm, more preferably in a range of 75 μm to 275 μm, particularly preferably in a range of 90 μm to 250 μm.

The average fiber diameter (average minor axis length) of the fibrous thermally conductive filler is not limited, and may be selected as appropriate. In terms of ensuring high thermal conductivity, the average fiber diameter is preferably in a range of 4 μm to 20 μm, and more preferably in a range of 5 μm to 14 μm.

The aspect ratio (average major axis length/average minor axis length) of the fibrous thermally conductive filler used is 6 or more, and is preferably 7 to 30, in terms of ensuring high thermal conductivity. Even in the case where the aspect ratio is low, the thermal conductivity improving effect and the like are obtained. However, significant property improving effect is not achieved for example due to poor orientation in such a case. The aspect ratio is therefore set to 6 or more. If the aspect ratio is more than 30, the dispersibility in the conductive thermally conductive sheet is low, as a result of which sufficient thermal conductivity is unlikely to be achieved.

Here, the average major axis length and the average minor axis length of the fibrous thermally conductive filler can each be calculated by averaging the lengths in a plurality of samples measured using, for example, a microscope or a scanning electron microscope (SEM).

The content of the conductive thermally conductive filler in the conductive thermally conductive sheet is not limited, and may be determined as appropriate depending on the purpose. The content is preferably 4 vol % to 40 vol %, more preferably 5 vol % to 30 vol %, and particularly preferably 6 vol % to 20 vol %. If the content is less than 4 vol %, it would be difficult to obtain sufficiently low thermal resistance. If the content is more than 40 vol %, the formability of the conductive thermally conductive sheet and the orientation property of the fibrous thermally conductive filler would be affected.

In the conductive thermally conductive sheet, the conductive thermally conductive filler is preferably oriented in one or more directions. As a result of orienting the thermally conductive filler, higher thermal conductivity and electromagnetic wave absorption can be achieved.

For example, to increase the thermal conductivity and electromagnetic wave suppression effect of the conductive thermally conductive sheet and improve the heat dissipation of the semiconductor device according to the present disclosure, the thermally conductive filler may be oriented in a direction substantially perpendicular to the sheet surface. Meanwhile, for example when the flow of electricity in the conductive thermally conductive sheet is changed, the thermally conductive filler may be oriented in a direction substantially parallel to the sheet surface or other directions.

Herein, the direction substantially perpendicular to the sheet surface and the direction substantially parallel to the sheet surface refer to a direction approximately perpendicular to the sheet surface direction and a direction approximately parallel to the sheet surface direction, respectively. Since the orientation direction of the conductive thermally conductive filler varies to some extent in manufacture, a deviation of approximately ±20° from the direction perpendicular to the sheet surface direction or the direction parallel to the sheet surface direction is acceptable in the present disclosure.

The method of adjusting the orientation angle of the conductive thermally conductive filler is not limited. For example, the orientation angle can be adjusted by producing a compact for a sheet, from which the conductive thermally conductive sheet is to be formed, and adjusting the cutting angle in a state in which the fibrous thermally conductive filler is oriented.

Inorganic Filler

The conductive thermally conductive sheet may further contain an inorganic filler, in addition to the binder resin and conductive thermally conductive fibers described above. This further enhances the thermal conductivity of the conductive thermally conductive sheet and improves the strength of the sheet.

The shape, material, average particle diameter, etc. of the inorganic filler are not limited, and may be selected as appropriate depending on the purpose. Examples of the shape include spherical, ellipsoidal, bulk, particulate, flat, and needle-like shapes. Of these, a spherical or ellipsoidal shape is preferable in terms of filling property, and a spherical shape is particularly preferable.

Examples of the material of the inorganic filler include aluminum nitride (AlN), silica, alumina (aluminum oxide), boron nitride, titania, glass, zinc oxide, silicon carbide, silicon, silicon oxide, aluminum oxide, and metal particles. These may be used alone or in combination of two or more. Of these, alumina, boron nitride, aluminum nitride, zinc oxide, and silica are preferable. In terms of thermal conductivity, alumina and aluminum nitride are particularly preferable.

The inorganic filler used may have been subjected to surface treatment. By treating the inorganic filler with a coupling agent for the surface treatment, the dispersibility of the inorganic filler is improved, and the flexibility of the conductive thermally conductive sheet is improved.

The average particle diameter of the inorganic filler may be determined as appropriate, depending on the type of the inorganic material and the like.

In the case where the inorganic filler is alumina, its average particle diameter is preferably 1 μm to 10 μm, more preferably 1 μm to 5 μm, and particularly preferably 4 μm to 5 μm. If the average particle diameter is less than 1 μm, the viscosity is high, which may hinder mixing. On the other hand, if the average particle diameter is more than 10 μm the thermal resistance of the conductive thermally conductive sheet would increase.

In the case where the inorganic filler is aluminum nitride, its average particle diameter is preferably 0.3 μm to 6.0 μm, more preferably 0.3 μm to 2.0 μm, and particularly preferably 0.5 μm to 1.5 μm. If the average particle diameter is less than 0.3 μm, the viscosity is high, which may hinder mixing. If the average particle diameter is more than 6.0 μm, the heat resistance of the conductive thermally conductive sheet would be high.

The average particle diameter of the inorganic filler can be found, for example, using a particle size distribution analyzer or a scanning electron microscope (SEM).

Magnetic Metal Powder

The conductive thermally conductive sheet preferably further contains a magnetic metal powder, in addition to the binder resin, fibrous thermally conductive filler, and inorganic filler. The inclusion of the magnetic metal powder increases the magnetic properties of the conductive thermally conductive sheet and improves the electromagnetic wave suppression effect of the semiconductor device.

The type of the magnetic metal powder is not limited as long as it increases the magnetic properties of the conductive thermally conductive sheet and improves the electromagnetic wave absorption, and a known magnetic metal powder may be selected as appropriate. For example, an amorphous metal powder or a crystalline metal powder may be used. Examples of the amorphous metal powder include Fe—Si—B—Cr-based, Fe—Si—B-based, Co—Si—B-based, Co—Zr-based, Co—Nb-based, and Co—Ta-based powders. Examples of the crystalline metal powder include pure iron, Fe-based, Co-based, Ni-based, Fe—Ni-based, Fe—Co-based, Fe—Al-based, Fe—Si-based, Fe—Si—Al-based, and Fe—Ni—Si—Al-based powders. As the crystalline metal powder, a microcrystalline metal powder obtained by adding a trace amount of N (nitrogen), C (carbon), O (oxygen), B (boron), or the like to a crystalline metal powder for refinement may be used.

For the magnetic metal powder, a mixture of two or more magnetic metal powders of different materials or different average particle diameters may be used.

The shape of the magnetic metal powder is preferably adjusted to be a spherical shape, a flat shape, or the like. For example, to obtain high filling property, a spherical magnetic metal powder having a particle diameter of several μm to several tens of μm is preferably used. Such a magnetic metal powder can be produced, for example, by atomization or a method of thermally decomposing metal carbonyl. The atomization has an advantage in that a spherical powder can be formed easily, and is a method of discharging molten metal from a nozzle and spraying a jet stream of air, water, inert gas, or the like to the discharged molten metal to solidify it as droplets, thus forming a powder. When producing an amorphous magnetic metal powder by atomization, the cooling rate is preferably set to approximately 1×106 (K/s), to prevent the molten metal from crystallization.

When an amorphous alloy powder is produced by atomization described above, the amorphous alloy powder particles have a smooth surface. When such an amorphous alloy powder with few surface irregularities and a small specific surface area is used as the magnetic metal powder, the filling property in the binder resin can be enhanced. The filling property can be further improved by performing coupling treatment.

The conductive thermally conductive sheet may optionally contain other components depending on the purpose, in addition to the binder resin, fibrous thermally conductive filler, inorganic filler, and magnetic metal powder described above.

Examples of the other components include thixotropic agents, dispersants, curing accelerators, retarders, tackifiers, plasticizers, flame retardants, antioxidants, stabilizers, and colorants.

<Method of Producing Semiconductor Device>

The method for producing the above-described semiconductor device according to the present disclosure is not limited.

For example, when the semiconductor device 1 of the embodiment as illustrated in FIG. 1 is produced, the method of producing the semiconductor device according to the present disclosure can use a method of production including a step of fixing by pressure the conductive thermally conductive sheet 10 to the upper end 20a of the tubular conductive shield can 20 provided to surround the side surface 30a of the semiconductor element 30, thereby joining the conductive shield can 20 and the conductive thermally conductive sheet 10.

The above step makes it possible to ensure the upper end 20a of the conductive shield can 20 to bite into the conductive thermally conductive sheet 10 without performing complicated steps, thus a semiconductor device providing excellent heat dissipation capacity and electromagnetic wave suppression effect can be efficiently produced.

In the method of producing a semiconductor device according to the present disclosure, steps other than the above-described step of fixing the conductive thermally conductive sheet 10 by pressure are not limited, and a known production method can be selected as appropriate.

EXAMPLES

More detailed description will be given below by way of examples, although the present disclosure is not limited to such examples.

Example 1

Figure 5A:
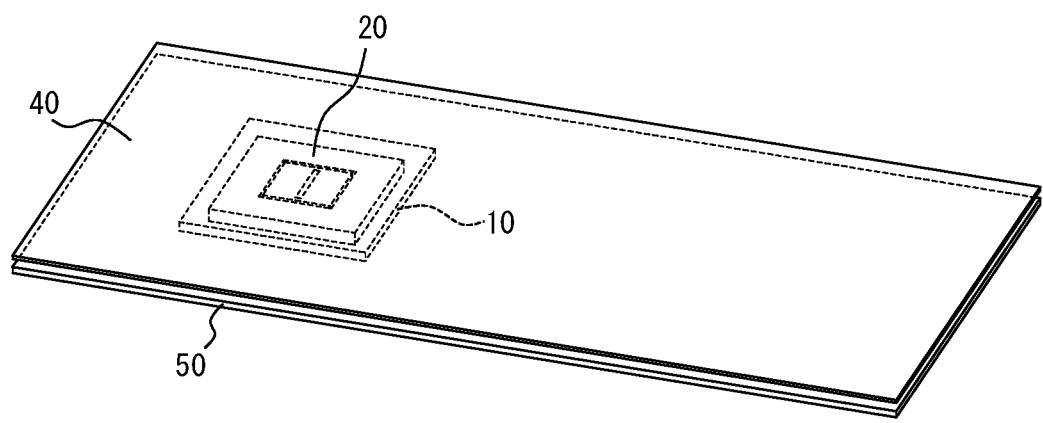
FIGS. 5A and 5B are diagrams illustrating a model for a semiconductor device used in analyses of the frequency response in Examples.
Figure 5B:
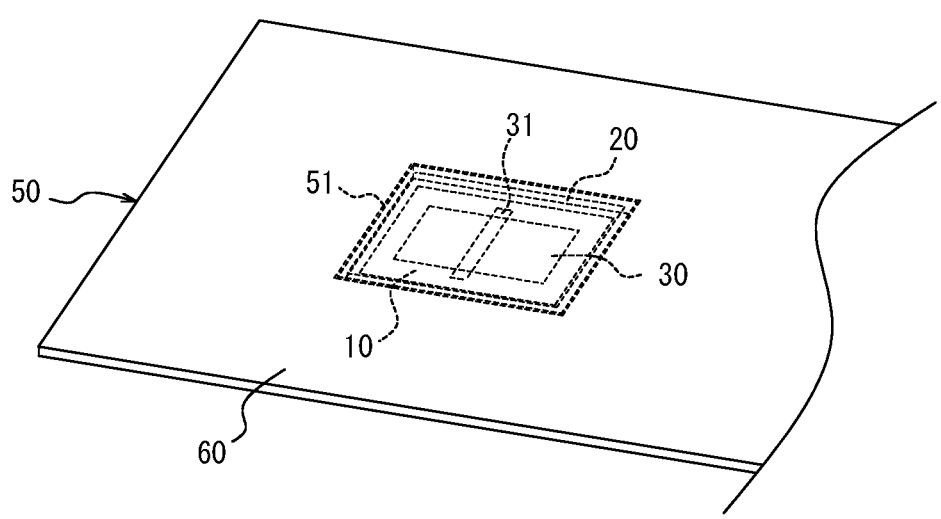

In Example 1, each analysis model of a semiconductor device as illustrated in FIGS. 5A and 5B was prepared using a 3D electromagnetic field simulator ANSYS HFSS (manufactured by ANSYS, Inc.), and its electromagnetic wave suppression effect was evaluated.

Figure 6:
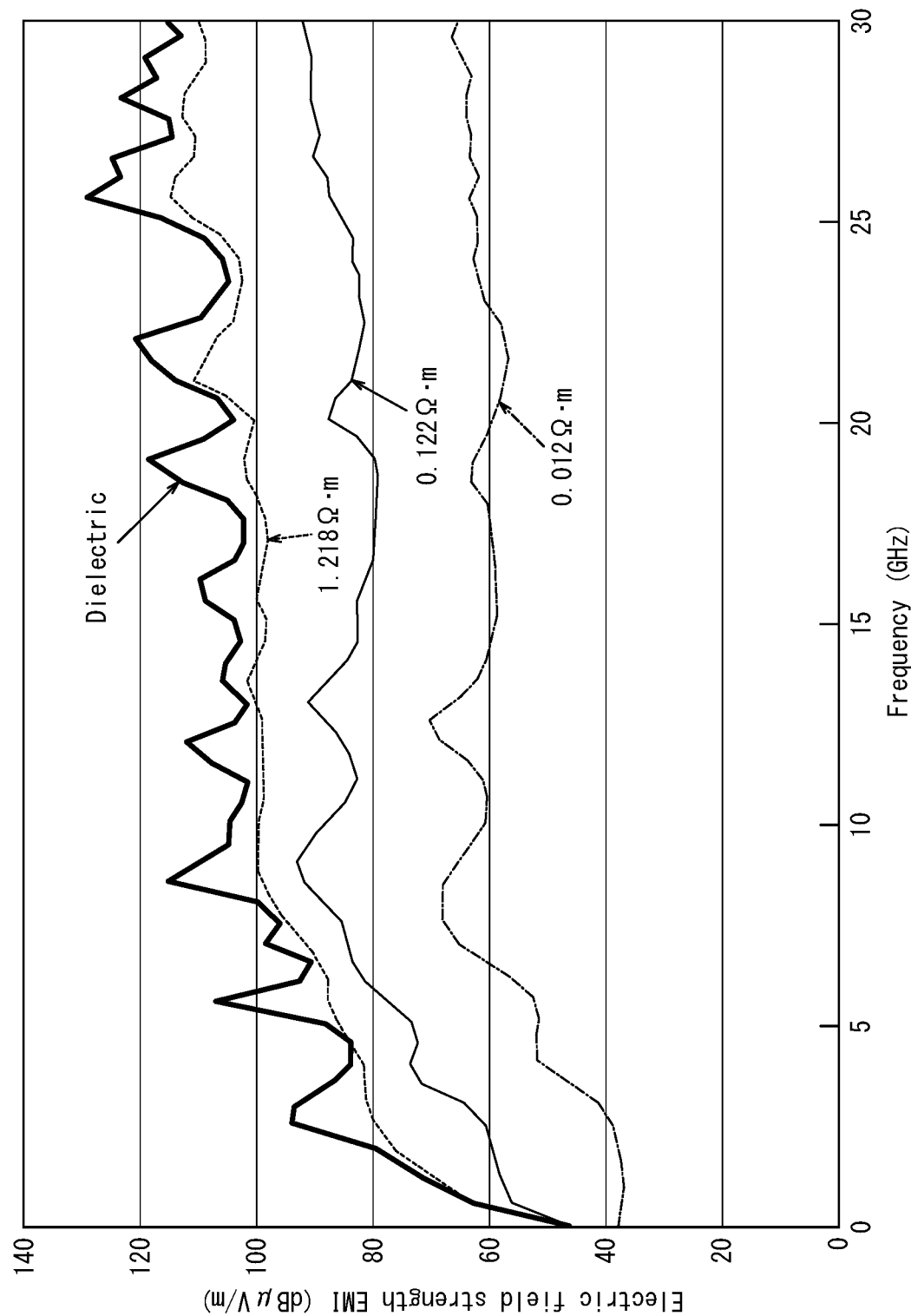
FIG. 6 is a graph of the electric field strength in accordance with the frequency in the case where the resistance value of a conductive thermally conductive sheet of a semiconductor device is changed in Example 1.

For the conductive thermally conductive sheet 10 used in the models of a semiconductor device, two-part addition-reaction type liquid silicone was used as a binder resin, alumina particles with an average particle diameter of 5 μm were used, and pitch-based carbon fibers ("thermally conductive fibers" manufactured by Nippon Graphite Fiber Corporation) with an average fiber length of 200 μm were used as a fibrous conductive thermally conductive filler, which were dispersed at a volume ratio (two-part addition-reaction type liquid silicone:aluminaparticles:pitch-based carbon fibers) of 35 vol %:53 vol %:12 vol % to prepare a silicone composition (composition for sheet). The resultant thermally conductive sheet had an average thermal conductivity in the vertical direction (the thermal resistance at the interface and the thermal resistance inside were calculated together) of 9.2 W/m·K as measured in accordance with ASTM D5470. The size of the conductive thermally conductive sheet 10 was 20 mm×20 mm, and its thickness was 1 mm. Samples having a resistivity of 1.218 Ω·m, 0.122 Ω·m, and 0.012 Ω·m and a sample having a significantly low conductivity (dielectric) were produced by changing the content of the pitch-based carbon fibers thereby changing the resistivity of the conductive thermally conductive sheet 10, as illustrated in FIG. 6.

For the cooling member 40 (heatsink) used in the models of a semiconductor device, an aluminum plate was used as material, with a size of 30 mm×30 mm and a thickness of 0.3 mm.

The conductive shield can 20 was a hollow quadrangular cylinder made of stainless steel with a thickness of 0.2 mm, with outer dimensions of 22 mm×22 mm×3 mm. The clearance between the cooling member 40 (heat sink) and the top surface of the conductive shield can 20 was 0.2 mm.

FIGS. 5A and 5B illustrate the analysis model of a semiconductor device and are a top view (upper side) and a bottom view (lower side), respectively. In FIGS. 5A and 5B, each member constituting the semiconductor device is illustrated in a perspective view to indicate the positional relationships between the members.

The sectional structure of the analysis model is the same as that in FIG. 1. The semiconductor element 30 was a microstripline (MSL) 31 covered with a resin mold, as illustrated in FIGS. 5A and 5B. The MSL 31 was obtained by providing a copper signal line (signal line size: 2 mm×1 mm×0.02 mm) on the front side of a dielectric substrate 50 (substrate size: 30 mm×30 mm×0.65 mm) and the ground 60 on the back side of the dielectric substrate 50. A signal source of the semiconductor element 30 was simplified using this MSL 31, with its ends being used as signal input and output ends. The body (the part molded with the resin) of the semiconductor element 30 was a dielectric having a relative permittivity of 4 and a dielectric loss tangent of 0.01. The size of the body of the semiconductor element 30 was 16 mm×16 mm×0.7 mm.

In the evaluation of the electromagnetic wave suppression effect, the maximum electric field strength at a position of 3 m away from the semiconductor device was calculated, and indicated as the electric field strength (dBμV/m) depending on frequency. FIG. 6 illustrates the electric field strength calculation results.

FIG. 6 illustrates the electric field strength calculation results using conductive thermally conductive sheets 10 of 1.218 Ω·m, 0.122 Ω·m, and 0.012 Ω·m and one having significantly low conductivity (dielectric).

From the results in FIG. 6, in the analysis models using the conductive thermally conductive sheets 10 of 1.218 Ω·m, 0.122 Ω·m, and 0.012 Ω·m within the range of the present disclosure, as compared with the analysis model using the conductive thermally conductive sheet 10 with a significantly low conductivity (dielectric), good electromagnetic wave suppression effect (electric field strength reduction) was found to be obtained.

The analysis models using the conductive thermally conductive sheets 10 having a low resistivity of 0.122 Ω·m and 0.012 Ω·m exhibited more excellent electromagnetic wave suppression effect.

Example 2

In Example 2, each analysis model of a semiconductor device as illustrated in FIGS. 5A and 5B was prepared using the 3D electromagnetic field simulator under similar conditions to those in Example 1, and its electromagnetic wave suppression effect was evaluated.

The resistivity of the conductive thermally conductive sheet 10 used in the model of a semiconductor device was 0.122 Ω·m.

As the conductive thermally conductive sheets 10 used in models of a semiconductor device, a sample was prepared under all the same conditions (size, thickness, and thermal conductivity are all the same as those in Example 1) except that part of the alumina was replaced with a magnetic powder (Fe—Si—B—Cr amorphous magnetic particles) and magnetic properties were imparted to achieve an imaginary part μr" of the relative permeability at 5 GHz of 3.

In the evaluation of the electromagnetic wave suppression effect, the electric field strength (dBμV/m) depending on frequency was calculated as in Example 1. The calculation results are given in FIG. 7.

In FIG. 7, the electric field strength obtained by the analysis model of a semiconductor device, having the conductive thermally conductive sheet 10 containing magnetic powder is represented as "magnetic powder contained (0.122 Ω·m)" and the electric field strength obtained by the analysis model of a semiconductor device, having the conductive thermally conductive sheet 10 containing magnetic powder is represented as "magnetic powder not contained (0.122 Ω·m)".

In the results in FIG. 7, in both the case where the conductive thermally conductive sheet 10 contained magnetic powder and the case where the conductive thermally conductive sheet 10 did not contain magnetic powder, high electromagnetic wave suppression effect was observed, whereas in the case where the conductive thermally conductive sheet 10 contained magnetic powder, more excellent electromagnetic wave suppression effect was observed.

INDUSTRIAL APPLICABILITY

Thus, a semiconductor device having excellent heat dissipation capacity and electromagnetic wave suppression effect can be provided.

REFERENCE SIGNS LIST 1 semiconductor device
10 conductive thermally conductive sheet
20 conductive shield can
20a upper end of conductive shield can
30 semiconductor element
30a side surface of semiconductor element
31 MSL
40 cooling member
50 substrate
51 land
52 conductively-treated through hole
60 ground
100 conventional semiconductor device
A electrically closed space
T thickness of conductive thermally conductive sheet
W spacing between parts of conductive shield can facing each other with semiconductor device therebetween

The invention claimed is:

1. A semiconductor device comprising:
a semiconductor element provided on a substrate;
a tubular conductive shield can provided to surround a side surface of the semiconductor element, the conductive shield can being connected to a ground;
a conductive cooling member provided over the semiconductor element and the conductive shield can; and
a thermally conductive sheet formed between the semiconductor element and the cooling member,
wherein the conductive shield can and the cooling member are electrically connected through the thermally conductive sheet therebetween, and
an upper end of the conductive shield can bites into the thermally conductive sheet.

2. The semiconductor device according to claim 1, wherein a spacing between parts of the conductive shield can facing each other with the semiconductor element therebetween is less than or equal to 1/10 of a wavelength at a maximum frequency of the semiconductor element.

3. The semiconductor device according to claim 1, wherein a resistivity of the thermally conductive sheet is 0.15 Ω·m or less.

4. The semiconductor device according to claim 1, wherein a resistivity of the thermally conductive sheet is $1.5 \times 10^{-7}$ Ω·m or more.

5. The semiconductor device according to claim 1, wherein the thermally conductive sheet has magnetic properties.

6. The semiconductor device according to claim 1, wherein the thermally conductive sheet has tackiness or adhesiveness at a surface thereof.

7. The semiconductor device according to claim 1, wherein the thermally conductive sheet has flexibility.

8. The semiconductor device according to claim 1, wherein the thermally conductive sheet contains a cured resin.

9. The semiconductor device according to claim 1, wherein the thermally conductive sheet contains a conductive filler.

10. The semiconductor device according to claim 9, wherein the conductive filler is carbon fiber.

11. A method of producing the semiconductor device according to claim 1, the method comprising:
   a step of fixing by pressure a thermally conductive sheet to an upper end of a tubular conductive shield can provided to surround a side surface of a semiconductor element, thereby joining the conductive shield can and the thermally conductive sheet.

* * * * *